US010775665B2

(12) United States Patent
Lee

(10) Patent No.: US 10,775,665 B2
(45) Date of Patent: Sep. 15, 2020

(54) DISPLAY APPARATUS

(71) Applicant: LG Display Co., Ltd., Seoul (KR)

(72) Inventor: SangHoon Lee, Osan-si (KR)

(73) Assignee: LG Display Co., Ltd., Seoul (KR)

( * ) Notice: Subject to any disclaimer, the term of this patent is extended or adjusted under 35 U.S.C. 154(b) by 18 days.

(21) Appl. No.: 16/195,465

(22) Filed: Nov. 19, 2018

(65) Prior Publication Data

US 2019/0163009 A1 May 30, 2019

(30) Foreign Application Priority Data

Nov. 30, 2017 (KR) .......................... 10-2017-0162765

(51) Int. Cl.
| | | |
|---|---|---|
| G02F 1/1335 | (2006.01) | |
| G02F 1/1333 | (2006.01) | |
| G02B 1/18 | (2015.01) | |
| H01L 27/32 | (2006.01) | |
| G02F 1/1362 | (2006.01) | |
| G02B 5/00 | (2006.01) | |
| H01L 51/52 | (2006.01) | |

(52) U.S. Cl.
CPC ......... G02F 1/133512 (2013.01); G02B 1/18 (2015.01); G02B 5/003 (2013.01); G02F 1/133345 (2013.01); G02F 1/133514 (2013.01); G02F 1/136209 (2013.01); H01L 27/3246 (2013.01); H01L 51/5246 (2013.01); H01L 51/5284 (2013.01); *H01L 27/322* (2013.01); *H01L 27/3272* (2013.01); *H01L 2251/5369* (2013.01)

(58) Field of Classification Search
CPC ......... G02F 1/133512; G02F 1/136209; G02F 1/133514; G02F 1/133345; G02F 1/13452; G02F 2201/50; H01L 51/5246; H01L 51/5284; H01L 27/3246; H01L 2251/5369; H01L 27/322; H01L 27/3272; G02B 5/003; G02B 1/18
See application file for complete search history.

(56) References Cited

U.S. PATENT DOCUMENTS

| | | | |
|---|---|---|---|
| 9,706,607 B2 | 7/2017 | Kim et al. | |
| 9,980,326 B2 | 5/2018 | Kim et al. | |
| 2012/0099056 A1* | 4/2012 | Lee ................. | B23K 26/009 349/106 |
| 2013/0082988 A1* | 4/2013 | Lee ......................... | G02F 1/13 345/205 |
| 2014/0160694 A1* | 6/2014 | Yoon ................... | G02F 1/1303 361/749 |

(Continued)

FOREIGN PATENT DOCUMENTS

| | | |
|---|---|---|
| KR | 10-2011-0048319 A | 5/2011 |
| KR | 10-2017-0093835 A | 8/2017 |

*Primary Examiner* — Kevin Quarterman
(74) *Attorney, Agent, or Firm* — Fenwick & West LLP

(57) ABSTRACT

A display apparatus is disclosed, which comprises a substrate including a pixel array layer and a pad portion connected to the pixel array layer; a circuit film attached to the pad portion; and a coating layer provided between the pixel array layer and the circuit film on the pad portion, wherein the coating layer contains a light-shielding material, whereby flexibility of the coating layer and bond stiffness of a circuit film may be secured and the pad portion and lines may be prevented from being damaged during a laser release process.

8 Claims, 7 Drawing Sheets

(56) References Cited

U.S. PATENT DOCUMENTS

| | | | |
|---|---|---|---|
| 2015/0002936 A1* | 1/2015 | Jun | G06F 1/1603 |
| | | | 359/492.01 |
| 2015/0187800 A1* | 7/2015 | Park | H01L 27/124 |
| | | | 349/43 |
| 2016/0174304 A1 | 6/2016 | Kim et al. | |
| 2016/0178943 A1* | 6/2016 | Hyodo | G02F 1/1339 |
| | | | 349/43 |
| 2016/0377905 A1* | 12/2016 | Choi | G02F 1/13458 |
| | | | 257/72 |
| 2017/0053976 A1* | 2/2017 | Oh | H01L 51/0097 |
| 2017/0290106 A1 | 10/2017 | Kim et al. | |
| 2017/0293176 A1* | 10/2017 | Bae | G02F 1/133512 |
| 2018/0045994 A1* | 2/2018 | Kwon | G02F 1/13306 |
| 2018/0092166 A1 | 3/2018 | Kim et al. | |

* cited by examiner

DISPLAY APPARATUS

CROSS-REFERENCE TO RELATED APPLICATIONS

This application claims the benefit of Republic of Korea Patent Application No. 10-2017-0162765 filed on Nov. 30, 2017, which is incorporated by reference in its entirety.

BACKGROUND

Technical Field

The present disclosure relates to a display apparatus.

Description of the Related Art

A display apparatus has been widely used as a display screen of a notebook computer, a tablet computer, a smartphone, a portable display apparatus, and a portable information apparatus, in addition to a display screen of a television or a monitor.

A liquid crystal display device and an organic light emitting display device display images by using a thin film transistor as a switching device. Since the liquid crystal display device is not a self-emission type, the liquid crystal display device displays images using light irradiated from a backlight unit arranged below a liquid crystal display panel. Since the liquid crystal display device has a backlight unit, there is a restriction in design, and luminance and response speed may be deteriorated. Since the organic light emitting display device includes an organic substance, the organic light emitting display device is vulnerable to water, whereby reliability and lifespan may be deteriorated.

Recently, studies and development of an organic light emitting display device using a micro light emitting diode are under progress, and the organic light emitting display device has received much attention as a next generation display device due to high definition and high reliability.

A display apparatus of the related art includes a display area corresponding to an active area of a thin film transistor array substrate and a non-display area corresponding to a non-active area. The display apparatus of the related art includes a display panel manufactured based on a lower substrate provided on a glass substrate, and an upper substrate to which the glass substrate is bonded is provided on the display area, and a pad portion is provided on the non-display area.

However, the display apparatus of the related art has a problem in that the pad portion and lines on the lower substrate are damaged during a process of removing the glass substrate bonded to the upper substrate through a laser release process. Also, the display apparatus of the related art has a problem in that the pad portion and lines are still damaged because a metal mask is not flexible and an edge of the glass substrate is not smooth despite that a mask process is performed using a metal mask which does not transmit a laser to prevent the pad portion and the lines from being damaged.

SUMMARY

The present disclosure has been made in view of the above problems, and it is an object of the present disclosure to provide a display apparatus that provides a coating layer containing a light-shielding material between a pixel array layer and a circuit film on a pad portion to prevent water from being permeated into the pixel array layer and prevent the pad portion and lines from being damaged by a laser release process.

It is another object of the present disclosure to provide a display apparatus that uses a coating layer obtained by mixing a moisture-proof insulating member with a light-shielding material at a certain ratio, whereby flexibility of the coating layer and bond stiffness of a circuit film may be secured and a laser may be shielded from being permeated into a pad portion and lines during a laser release process.

It is other object of the present disclosure to provide a display apparatus that uses a coating layer obtained by mixing a moisture-proof insulating member having a hydrophobic property and a low Young's Modulus with a light-shielding material having a low laser transmittance at a certain ratio, whereby the coating layer may be realized to be applicable to a flexible display and a stretchable display.

In accordance with an aspect of the present disclosure, the above and other objects can be accomplished by the provision of a display apparatus comprising a substrate including a pixel array layer and a pad portion connected to the pixel array layer; a circuit film attached to the pad portion; and a coating layer provided between the pixel array layer and the circuit film on the pad portion, wherein the coating layer contains a light-shielding material.

Details of the other example are included in the detailed description and drawings.

BRIEF DESCRIPTION OF DRAWINGS

The above and other objects, features and other advantages of the present disclosure will be more clearly understood from the following detailed description taken in conjunction with the accompanying drawings.

DETAILED DESCRIPTION

Figure 1:
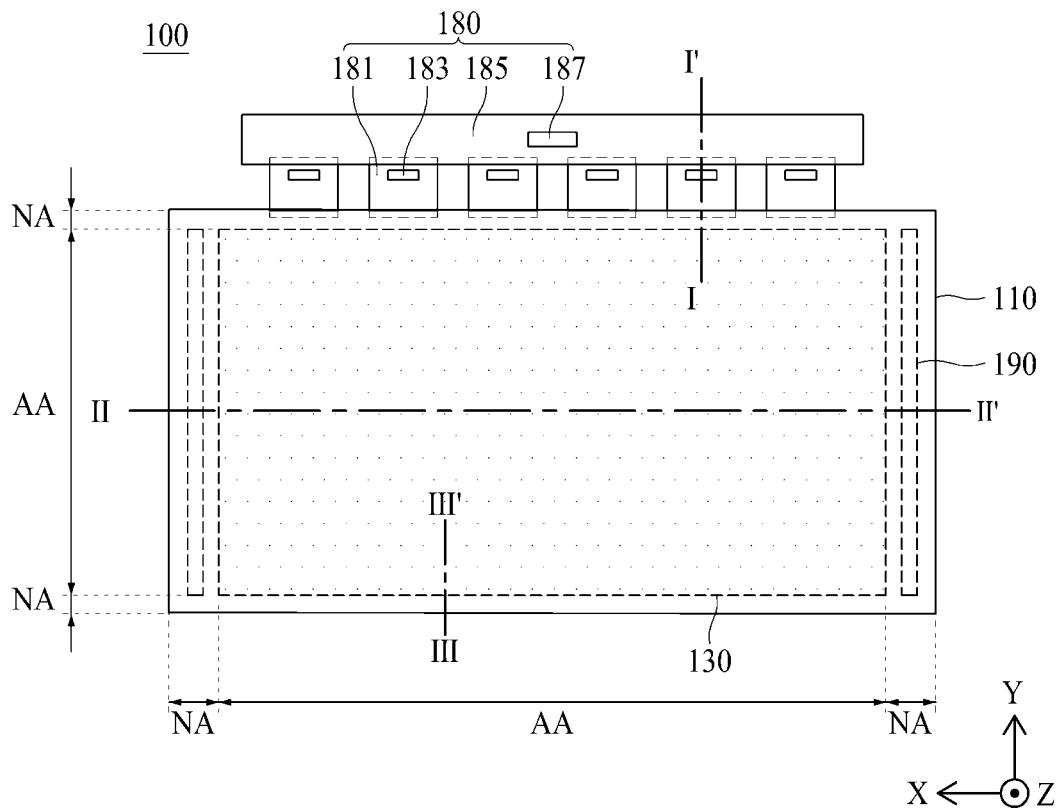
FIG. 1 is a plane view illustrating a display apparatus according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~', and 'next to~', one or more portions may be arranged between two other portions unless 'just' or 'direct' is used.

It will be understood that, although the terms "first", "second", etc. may be used herein to describe various elements, these elements should not be limited by these terms. These terms are only used to distinguish one element from another element. For example, a first element could be termed a second element, and, similarly, a second element could be termed a first element, without departing from the scope of the present disclosure.

In describing elements of the present disclosure, the terms "first", "second", etc. may be used. These terms are intended to identify corresponding elements from the other elements, and basis, order, or number of the corresponding elements are not limited by these terms. The expression that an element is "connected" or "coupled" to another element should be understood that the element may directly be connected or coupled to another element, a third element may be interposed between the corresponding elements, or the corresponding elements may be connected or coupled to each other through a third element.

Therefore, the display apparatus in the present disclosure may include a display apparatus in a narrow sense such as liquid crystal monitor (LCM) and organic light-emitting diode (OLED) module, and a set apparatus which is an application product or final consumer apparatus including LCM and OLED module.

For example, if a display panel is an OLED display panel, the display panel may include a plurality of gate and data lines, and pixels formed in crossing areas of the gate lines and the data lines. Also, the display panel may include an array substrate including a thin film transistor which is an element for selectively applying a voltage to each pixel, an organic light emitting diode (OLED) layer on the array substrate, and an encapsulation substrate arranged on the array substrate to cover the OLED layer. The encapsulation substrate may protect the thin film transistor and the OLED layer from external impact, and may prevent water or oxygen from being permeated into the OLED layer. The layer formed on the array substrate may include an inorganic light emitting layer, for example, a nano-sized material layer or quantum dot.

The display panel may further include a backing such as a metal plate attached to the display panel. The display panel may include another structure without limitation to the metal plate.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, the embodiments of the present disclosure will be described in detail with reference to the accompanying drawings.

Figure 2:
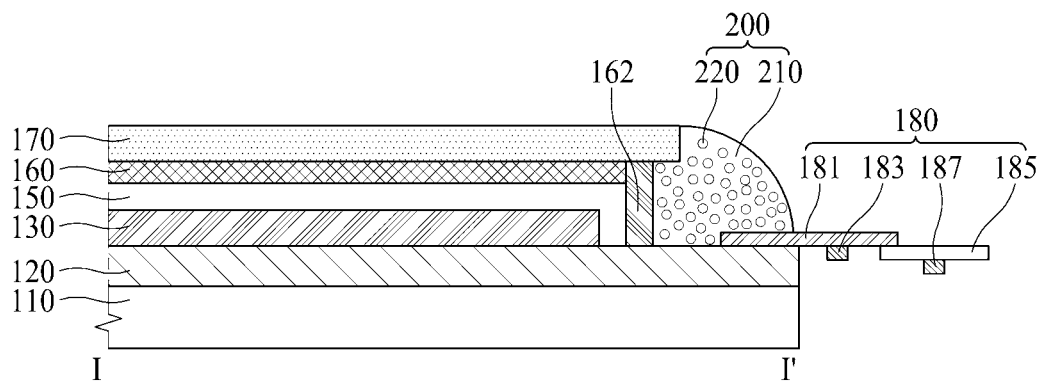
FIG. 2 is a cross-sectional view taken along line I-I' in a display apparatus according to one embodiment of the present disclosure.
Figure 3:
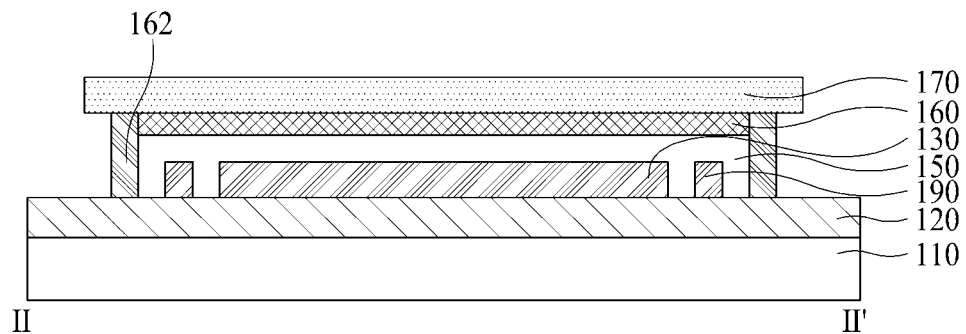
FIG. 3 is a cross-sectional view taken along line II-II' in a display apparatus according to one embodiment of the present disclosure.
Figure 4:
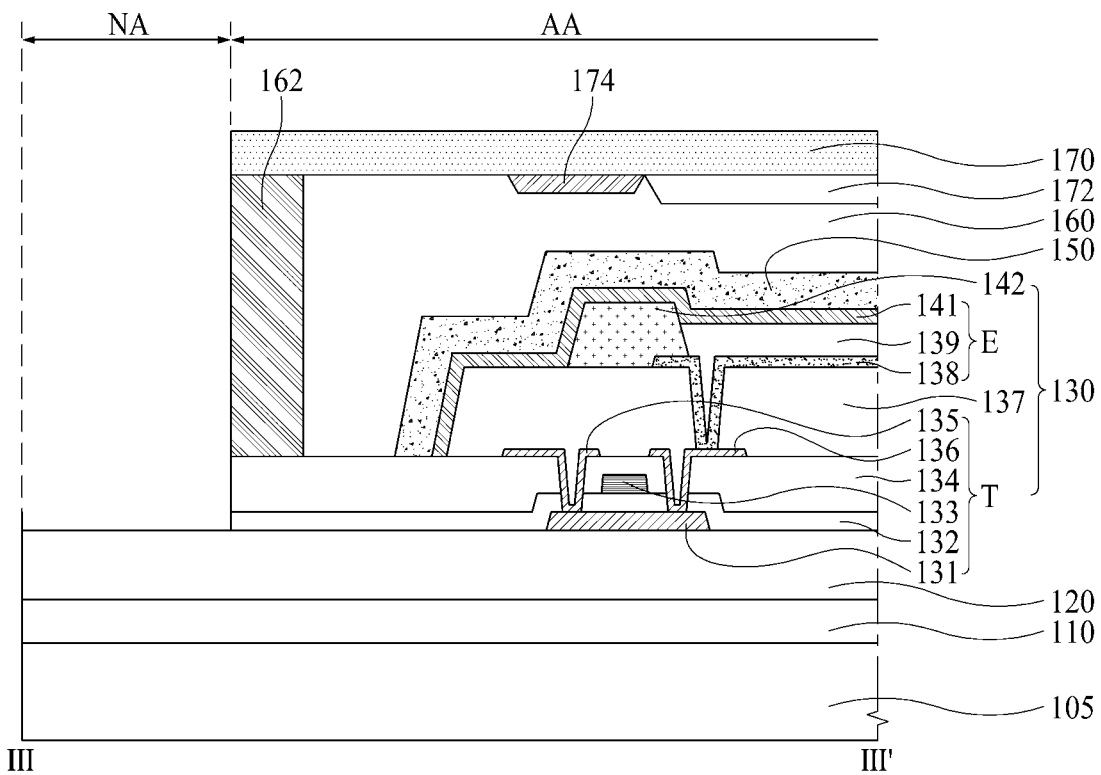
FIG. 4 is a cross-sectional view taken along line in a display apparatus according to one embodiment of the present disclosure.

FIG. 1 is a plane view illustrating a display apparatus according to one embodiment of the present disclosure, FIG. 2 is a cross-sectional view taken along line I-I' in a display apparatus according to one embodiment of the present disclosure, FIG. 3 is a cross-sectional view taken along line II-II' in a display apparatus according to one embodiment of the present disclosure, and FIG. 4 is a cross-sectional view taken along line III-III' in a display apparatus according to one embodiment of the present disclosure.

Referring to FIGS. 1 to 4, the display apparatus 100 includes a first substrate 110, a multi-buffer layer 120, a pixel array layer 130, an encapsulation layer 150, a filling layer 160, a second substrate 170, a display driving circuit 180, a scan driving circuit 190, and a coating layer 200.

The first substrate 110 is a base substrate, and may be a flexible substrate. For example, the first substrate 110 may include a transparent polyimide material. Considering that a deposition process of a high temperature is performed, polyimide having excellent heat resistance tolerable for a high temperature may be used as the first substrate 110 of a polyimide material. The first substrate 110 made of a polyimide material may be a hardened polyimide resin coated with a constant thickness on a front surface of a sacrificial layer provided on a carrier glass substrate. The carrier glass substrate may be separated from the first substrate 110 by release of the sacrificial layer using a laser release process after the first substrate 110 and the second substrate 170 are completely bonded to each other and a circuit film 181 is formed on a non-display area NA of the first substrate 110. The sacrificial layer may be made through an amorphous silicon (a-Si) or a silicon nitride film (SiNx).

According to one embodiment, the first substrate 110 may be a glass substrate. For example, the first substrate 110 may include $SiO_2$ or $Al_2O_3$ as a main component.

The first substrate 110 may include a display area AA and a non-display area NA. The display area AA is an area for displaying an image, and may be defined at a center portion of the first substrate 110. In this case, the display area AA may correspond to an active area of the pixel array layer 130. For example, the display area AA may include a plurality of pixels (not shown) formed per pixel area crossed by a plurality of gate lines (not shown) and a plurality of data lines (not shown). In this case, each of the plurality of pixels may be defined as an area of a minimum unit for emitting light.

The non-display area NA is an area where an image is not displayed, and may be defined at an edge portion of the first substrate 110 surrounding the display area AA.

According to one embodiment, the display apparatus 100 may further include a first cover film 105 provided below the first substrate 110. The first cover film 105 may be provided below the first substrate 110 to support the first substrate 110 and protect the first substrate 110.

The multi-buffer layer 120 may be provided on the first substrate 110. The multi-buffer layer 120 may be formed on an entire surface of the first substrate 110 to shield water from permeating into the pixel array layer 130 through the first substrate 110. The multi-buffer layer 120 may be formed in such a manner that a plurality of inorganic films are deposited. For example, the multi-buffer layer 120 may be formed of a multi-layered film of one or more inorganic films of a silicon oxide (SiOx) film, a silicon nitride (SiNx) film and a SiON film, which are deposited alternately.

The multi-buffer layer 120 may include a plurality of buffer layers. The plurality of buffer layers are sequentially deposited on the first substrate 110, and may be metal buffer layers. For example, each of the plurality of buffer layers may include at least one of SiOx, SiNx, and SiON. Each of the plurality of buffer layers may sequentially be deposited on the first substrate 110 through sputtering or e-beam (electron beam) evaporation. As the multi-buffer layer 120 may include a plurality of buffer layers, a water vapor transmission rate (WVTR) of a panel may be improved.

The pixel array layer 130 may include a thin film transistor T, a planarization layer 137, an organic light emitting diode E, and a bank 142.

The thin film transistor T may be provided in the display area AA on the multi-buffer layer 120. The thin film transistor T may include a semiconductor layer 131, a gate insulating layer 132, a gate electrode 133, a passivation layer 134, a drain electrode 135, and a source electrode 136.

The semiconductor layer 131 may be provided in the display area AA of the first substrate 110. The semiconductor layer 131 may be arranged to overlap the gate electrode 133, the drain electrode 135, and the source electrode 136. The semiconductor layer 131 may be directly in contact with the drain electrode 135 and the source electrode 136, and may face the gate electrode 133 by interposing the gate insulating layer 132 there between. According to one embodiment, a part of the semiconductor layer 131 may be made of a semiconductor material which is not doped with a dopant, and the other part of the semiconductor layer 131 may be made of a semiconductor material which is doped with a dopant.

The gate insulating film 132 may be provided on the semiconductor layer 131. In detail, the gate insulating film 132 may be arranged on the semiconductor layer 131 and the multi-buffer layer 120, and may insulate the semiconductor layer 131 from the gate electrode 133. The gate insulating film 132 may be formed on an entire surface of the display area AA of the first substrate 110, and a corresponding area of the gate insulating film 132 may be removed such that the semiconductor layer 131 may be in contact with the drain electrode 135 or the source electrode 136. For example, the gate insulating film 132 may include a first contact hole through which the drain electrode 135 passes, and a second contact hole through which the source electrode 136 passes. The gate insulating film 132 may be made of, but not limited to, an inorganic insulating material, for example, $SiO_2$ (silicon dioxide), SiNx (silicon nitride), SiON, or a multi-layered film of $SiO_2$, SiNx and SiON.

The gate electrode 133 may be provided on the gate insulating film 132. The gate electrode 133 may be overlapped with a center area of the semiconductor layer 131 by interposing the gate insulating film 132 therebetween. For example, the gate electrode 133 may be, but not limited to, a single layer or multi-layer comprised of any one of Mo, Al, Cr, Au, Ti, Ni, Nd and Cu or their alloy.

The passivation layer 134 may be provided on the gate electrode 133. The passivation layer 134 may serve to protect the thin film transistor T. The passivation layer 134 may be made of, but not limited to, an inorganic insulating material, for example, $SiO_2$ (silicon dioxide), SiNx (silicon nitride), SiON, or a multi-layered film of $SiO_2$, SiNx and SiON. A corresponding area of the passivation layer 134 may be removed such that the semiconductor layer 131 may be in contact with the drain electrode 135 or the source electrode 136. For example, the passivation layer 134 may include a first contact hole through which the drain electrode 135 passes, and a second contact hole through which the source electrode 136 passes. In this case, the first and second contact holes of the passivation layer 134 may respectively be connected with the first contact hole or the second contact hole of the gate insulating film 132.

The drain electrode 135 and the source electrode 136 may be provided to be spaced apart from each other on the passivation layer 134. The drain electrode 135 may be in contact with one end of the semiconductor layer 131 through first contact holes provided in the gate insulating film 132 and the passivation layer 134, and source electrode 136 may be in contact with the other end of the semiconductor layer 131 through second contact holes provided in the gate insulating film 132 and the passivation layer 134. The source electrode 136 may directly be in contact with an anode electrode 138 of the organic light emitting diode E through a third contact hole of the planarization layer 137.

The planarization layer 137 may be provided on the thin film transistor T to planarize an upper end of the thin film transistor T. A corresponding area of the planarization layer 137 may be removed such that the anode electrode 138 may be in contact with the source electrode 136. For example, the planarization layer 137 may include a third contact hole through which the anode electrode 138 passes. According to one embodiment, the planarization layer 137 may be made of, but not limited to, an organic insulating material such as acrylic resin, epoxy resin, phenolic resin, polyamides resin, and polyimides resin. The planarization layer 137 may not be extended to the non-display area NA.

The organic light emitting diode E is provided on the planarization layer 137, and may electrically be connected with the thin film transistor T. The organic light emitting diode E may include an anode electrode 138, an organic light emitting layer 139, and a cathode electrode 141.

The anode electrode 138 may be provided on the planarization layer 137. The anode electrode 138 may be in contact with the source electrode 136 of the thin film transistor T through the third contact hole provided in the planarization layer 137. According to one embodiment, the anode electrode 138 may be made of a transparent conductive material, such as ITO, IZO, ZnO, or $In_2O_3$, which has a great work function value, and thus may serve as an anode.

The organic light emitting layer 139 may be provided on the anode electrode 138. The organic light emitting layer 139 may be provided on an individual pixel area, for example, defined by the bank 142. According to one embodiment, the organic light emitting layer 139 may include a hole transporting layer, an organic light emitting layer, and an electron transporting layer. Moreover, the organic light emitting layer 139 may further include at least one function layer for improving emission efficiency and/or lifespan of the light emitting layer.

The cathode electrode 141 may be provided on the organic light emitting layer 139. The cathode electrode 141 may be realized as an electrode type common to all pixels without being divided per pixel area. That is, the cathode electrode 141 may be formed on the bank 142 as well as the organic light emitting layer 139. If a voltage is applied to the anode electrode 138 and the cathode electrode 141, holes and electrons are moved to the organic light emitting layer through the hole transporting layer and the electron transporting layer, respectively, and are combined with each other in the organic light emitting layer to emit light. The cathode electrode 141 may serve as a cathode of the organic light emitting diode E, and may be realized as an opaque metal material made of Li, Ca, LiF/Ca, LiF/Al, Al, Mg, or their compound.

The bank 142 may be provided on the planarization layer 137. The bank 142 may be provided between anode electrodes 138 adjacent to each other to partition the anode electrodes 138. Therefore, the bank 142 may electrically insulate the adjacent anode electrodes from each other. The bank 142 may be made of, but not limited to, an organic insulating material such as polyimides resin, acrylic resin, and benzocyclobutene (BCB).

The encapsulation layer 150 may be provided on the entire upper end of the cathode electrode 141. The encapsulation layer 150 may prevent water from permeating from the outside, whereby degradation of the organic light emitting layer 139 may be avoided. According to one embodiment, the encapsulation layer 150 may be made of metal such as Cu and Al or their alloy, but may be realized as various materials without limitation to this example.

The filling layer 160 is filled in a space between the first substrate 110 and the second substrate 170, and is not spread to the outside of the display apparatus 100 by a dam 162. The filling layer 160 may be arranged between the first substrate 110 and the second substrate 170 to avoid light loss, and may increase an adhesion between the first substrate 110 and the second substrate 170.

The dam 162 may be interposed between the first substrate 110 and the second substrate 170. The dam 162 may be realized in the form of a frame surrounding the display area AA. The dam 162 may partially be overlapped with the planarization layer 137, the cathode electrode 141 and the encapsulation layer 150 but not necessarily so. According to one embodiment, the dam 162 may be made of an organic film such as polyimides resin, acrylic resin, and BCB, which can form a fine pattern. The dam 162 may prevent the filling layer 160 from being spread to the outside of the display apparatus 100. Also, the dam 162 may bond the first substrate 110 to the second substrate 170.

The second substrate 170 may be provided on the entire upper end of the filling layer 160. The second substrate 170 may be arranged on the first substrate 110 to shield the thin film transistor T and the organic light emitting diode E provided on the first substrate 110 from external water, air, etc. According to one embodiment, the second substrate 170 may be arranged to face the first substrate 110, and the first substrate 110 and the second substrate 170 may be bonded to each other by a sealing member (not shown) arranged along their edges. For example, the second substrate 170 may be a glass substrate or a plastic substrate.

The color filter 172 may be arranged between the filling layer 160 and the second substrate 170. The color filter 172 may be arranged on the organic light emitting diode E to covert a color of white light emitted from the organic light emitting diode E. For example, the color filter 172 may include a red color filter, a green color filter, and a blue color filter. Therefore, a red sub pixel, a green sub pixel, and a blue sub pixel of the plurality of sub pixels may include the color filter 172, and a white sub pixel may be realized without a color filter.

The black matrix 174 may be arranged between the filling layer 160 and the second substrate 170. The black matrix 174 may be arranged at both sides of the color filter 172 so as not to overlap the organic light emitting diode E, whereby light may be prevented from leaking to the non-display area NA, and light leakage and visibility deterioration may be solved.

The display driving circuit 180 may be connected to a pad portion (not shown) provided in the non-display area NA of the first substrate 110, and may display an image corresponding to image data supplied from a display driving system on each pixel. According to one embodiment, the display driving circuit 180 may include a plurality of circuit films 181, a plurality of data driving integrated circuits 183, a printed circuit board 185, and a timing controller 187.

Input terminals provided at one side of each of the plurality of circuit films 181 may be attached to the printed circuit board 185 by a film attachment process, and output terminals provided at the other side of each of the plurality of circuit films 181 may be attached to the pad portion by a film attachment process. Each of the plurality of circuit films 181 may be realized as a flexible circuit film to reduce a bezel area of the display apparatus 100, and may be bent to surround a side of the second substrate 170.

Each of the plurality of data driving integrated circuits 183 may be packaged in each of the plurality of circuit films 181. Each of the plurality of data driving integrated circuits 183 may receive a data control signal and pixel data supplied from the timing controller 187, convert the pixel data to an analog type data signal in accordance with the data control signal and supply the converted data signal to a corresponding data line. For example, each of the plurality of data driving integrated circuits 183 may be arranged at the side of the second substrate 170 in accordance with bending of the corresponding circuit film 181.

The printed circuit board 185 may support the timing controller 187 and transfer signals and power sources between elements of the display driving circuit 180. The printed circuit board 185 may be arranged on a front surface of the second substrate 170 in accordance with bending of the circuit film 181.

The timing controller 187 may be packaged in the printed circuit board 185, and may receive image data provided from the display driving system and a timing synchronization signal through a user connector provided in the printed circuit board 185. The timing controller 187 may generate pixel data by aligning the image data to be matched with a pixel arrangement structure on the basis of the timing synchronization signal, and may provide the generated pixel data to the corresponding data driving integrated circuit 183. Also, the timing controller 187 may generate each of a data control signal and a scan control signal on the basis of the timing synchronization signal, control a driving timing of each of the plurality of data driving integrated circuits 183 through the data control signal and control a driving timing of the scan driving circuit 190 through the scan control signal. In this case, the scan control signal may be supplied to the corresponding scan driving circuit 190 through the first and/or last flexible circuit film of the plurality of flexible circuit films 181.

The scan driving circuit 190 may be provided on the non-display area NA of the first substrate 110. The scan driving circuit 190 may generate a scan signal in accordance with the scan control signal provided from the display driving circuit 180 and supply the generated scan signal to a scan line corresponding to a set order. According to one embodiment, the scan driving circuit 190 may be formed in the non-display area NA of the first substrate 110 together with the thin film transistor.

The coating layer 200 may be provided between the pixel array layer 130 and the circuit film 181 on the pad portion. In detail, the coating layer 200 may be provided to directly cover the side of the dam 162, the upper surface of the multi-buffer layer 120, and the circuit film 181 on the pad portion. That is, the coating layer 200 may cover (directly or indirectly) a contact surface between the circuit film 181 and the pad portion, the side of the pixel array layer 130, the side of the encapsulation layer 150, the side of the filling layer 160, the side of the second substrate 170, and the upper surface of the first substrate 110 exposed between the circuit film 181 and the pixel array layer 130. Therefore, the coating layer 200 may prevent water or particles from being permeated into the pixel array layer 130 and the pad portion and prevent the pad portion from being electrode-shorted by reaction with an external environment such as a temperature, water, corrosive gas, or conductive particles. The coating layer 200 may obtain bond stiffness of the circuit film 181 while having flexibility to be applicable to a flexible display apparatus and a stretchable display apparatus, and may prevent the pad portion and lines on the first substrate 110 from being damaged during a laser release process.

The coating layer 200 may include a moisture-proof insulating member 210 for preventing water from being permeated into the pixel array layer 130, and a light-shielding material 220 mixed with the moisture-proof insulating member 210. For example, the coating layer 200 may be formed through a thermal hardening process after mixing the moisture-proof insulating member 210 with the light-shielding material 220. Young's modulus, a water contact angle and laser transmittance of the coating layer 200 may be determined in accordance with materials and mixing ratio of the moisture-proof insulating member 210 and the light-shielding material 220.

According to one embodiment, the moisture-proof insulating member 210 may be polydimethylsiloxane (PDMS). In detail, the moisture-proof insulating member 210 may be formed by mixing a silicon elastomer base with a silicon elastomer curing agent at a specific ratio. In this case, Young's modulus, a dielectric constant, and water contact angle of the coating layer 200 may be determined in accordance with a mixing ratio of a silicon elastomer base and a silicon elastomer curing agent. The moisture-proof insulating member 210 may be used for a flexible display apparatus and a stretchable display apparatus by mixing a silicon elastomer base with a silicon elastomer curing agent to have a low Young's modulus and a high Poisson's ratio.

According to one embodiment, the moisture-proof insulating member 210 may be formed by mixing a silicon elastomer base with a silicon elastomer curing agent to have a Young's modulus of 360 kPa to 870 kPa. In this case, Young's modulus means an elastic coefficient which indicates a relation between a pressure applied to an object and deformation of the object according to the pressure. That is, Young's modulus means a deformation force required when an object is deformed as much as a unit rate, and indicates an original elastic force of the object. For example, if Young's modulus is low, the object may be deformed as much as a unit rate even by a low deformation force, and if Young's modulus is high, a high deformation force is required to deform the object as much as a unit rate. Therefore, the moisture-proof insulating member 210 has Young's modulus of 360 kPa to 870 kPa, whereby the Young's modulus is lower than that of the existing moisture-proof insulating member and may be used for a flexible display apparatus and a stretchable display apparatus.

According to one embodiment, the moisture-proof insulating member 210 may be formed by mixing a silicon elastomer base with a silicon elastomer curing agent to have a Poisson's ratio of 0.48 to 0.5. In this case, the Poisson's ratio means a ratio between a horizontal deformation and a vertical deformation when a tensile force is applied to an object. For example, when the object corresponds to a complete incompressible material of which volume is not changed with respect to an external pressure, the Poisson's ratio may have a value of 0.5. Therefore, the moisture-proof insulating member 210 has Poisson's ratio of 0.48 to 0.5, whereby the moisture-proof insulating member 210 has a Poisson's ratio higher than that of the existing moisture-proof insulating member and may be used for a flexible display apparatus and a stretchable display apparatus.

According to one embodiment, the moisture-proof insulating member 210 may be formed by mixing a silicon elastomer base with a silicon elastomer curing agent to have a water contact angle of 100° or more. The moisture-proof insulating member 210 may have hydrophobicity by having a water contact angle of 100° or more. In this case, the water contact angle means an angle between water and a surface of an object on the surface of the object. For example, if the water contact angle is small, the object has hydrophilicity, and if the water contact angle is great, the object has hydrophobicity. Therefore, the moisture-proof insulating member 210 may have a water contact angel of 100° or more to improve water vapor transmission rate (WVTR) of the display panel, whereby water may be prevented from being permeated into the display panel.

According to one embodiment, the moisture-proof insulating member 210 may have a dielectric constant of 2.3 to 2.8 to prevent parasitic capacitance from being formed on the first substrate 110. In detail, since the moisture-proof insulating member 210 has a dielectric constant of 2.3 to 2.8, the moisture-proof insulating member 210 corresponds to a nonconductor. Since the moisture-proof insulating member 210 forms a cell surrounding the light-shielding material even though the light-shielding material 220 is contained therein, parasitic capacitance may be prevented from being formed on the first substrate 110 to prevent magnetic field interference and electron interference from occurring on the first substrate 110. Therefore, since the moisture-proof insulating member 210 has a dielectric constant of 2.3 to 2.8, the pad portion and the lines on the first substrate 110 may be prevented from being electrode-shorted.

The light-shielding material 220 may be mixed with the moisture-proof insulating member 210 at a certain ratio to reduce a laser transmittance of the coating layer 200. According to one embodiment, the light-shielding material 220 may include a material for reducing Ultraviolet (UV) transmittance of ultraviolet rays irradiated during a laser release process. The light-shielding material 220 may include a material that may absorb ultraviolet rays by having a bandgap energy of 3.2 eV to 3.6 eV. For example, the light-shielding material 220 may be a nano-particle composition that includes at least one of ZnO, GaN, AlGaN, InGaN, AlN, InN, SiC, and $\beta$-$Ga_2O_3$. Therefore, the light-shielding material 220 may reduce transmittance of ultraviolet rays irradiated during a laser release process for removing a carrier glass substrate by being mixed with the moisture-proof insulating member 210, thereby preventing the pad portion and the lines from being damaged.

According to one embodiment, the coating layer 200 may include the light-shielding material 220 mixed at a rate of 15 weight % to 50 weight %. In detail, the coating layer 200 may be formed by mixing the light-shielding material 220 with the moisture-proof insulating member 210 at a rate of 15 weight % to 50 weight %. For example, the coating layer 200 may be formed by mixing the light shielding material 220 having a rate of 15 weight % to 50 weight % with a silicon elastomer base and a silicon elastomer curing agent and then performing a thermal hardening process. Therefore, the light-shielding material 220 may maintain an elastic force to be used to a flexible display apparatus and a stretchable display apparatus while maintaining a moisture-proof insulating function, and may shield permeation of ultraviolet rays during a laser release process. As a result, the coating layer 200 may prevent water or particles from permeating into the display panel, prevent the pad portion and the lines on the first substrate 110 from being electrode-shorted by reaction with an external environment such as a temperature, water, corrosive gas, or conductive particles, and prevent the pad portion and the lines on the first substrate 110 from being damaged by UV laser during a laser release process.

According to one embodiment, the mixing ratio of the moisture-proof insulating member 210 and the light-shielding material 220 may be identified by cutting a cross-section of the coating layer 200. In detail, the coating layer 200 may be formed by mixing the moisture-proof insulating material 210 with the light shielding material 220 and performing a thermal hardening process. For example, the coating layer 200 may be cut through a focused ion beam (FIB), and the moisture-proof insulating member 210 and the light-shielding material 220 may be cut by the FIB to have a flat cross-section. At this time, an area of the cutting surface of the coating layer 200 may correspond to a sum of an area of the moisture-proof insulating member 210 and an area of the light-shielding material 220. In this case, each of the area of the moisture-proof insulating member 210 and the area of the light-shielding material 220 may be identified through an electron microscope (for example, scanning electron microscope (SEM)). An area ratio of the light-shielding material 220 and a weight % ratio of the light-shielding material 220 may be proportional to each other. Therefore, the mixing ratio of the moisture-proof insulating member 210 and the light-shielding material 220 may be identified by calculating the area ratio of the light-shielding material 220 from the area of the cutting surface of the coating layer 200.

According to one embodiment, the coating layer 200 may further include Toluene to adjust viscosity of the coating layer 200. In detail, the coating layer 200 may further include Toluene to adjust viscosity of the coating layer 200 during a process of mixing the silicon elastomer base, the silicon elastomer curing agent, and the light-shielding material 200 with one another. Therefore, the coating layer 200 may adjust an elastic force and flexibility of the coating layer 200 by further including Toluene.

Figure 5:
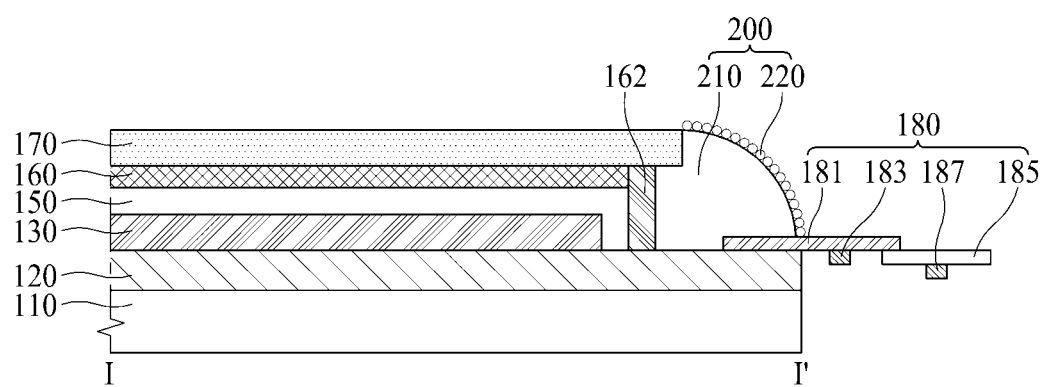
FIG. 5 is a cross-sectional view taken along line I-I' in a display apparatus according to one embodiment of the present disclosure.

FIG. 5 is a cross-sectional view taken along line I-I' in a display apparatus according to another embodiment of the present disclosure. In this case, the display apparatus of FIG. 5 is different from that of FIG. 2 in the coating layer 200, and the same elements as those of the aforementioned description will be described briefly or omitted.

Referring to FIG. 5, the coating layer 200 may be provided between the pixel array layer 130 and the circuit film 181 on the pad portion. In detail, the coating layer 200 may be provided to directly cover the side of the dam 162, the upper surface of the multi-buffer layer 120, and the circuit film 181 on the pad portion. That is, the coating layer 200 may cover (directly or indirectly) a contact surface between the circuit film 181 and the pad portion, the side of the pixel array layer 130, the side of the encapsulation layer 150, the side of the filling layer 160, the side of the second substrate 170, and the upper surface of the first substrate 110 exposed between the circuit film 181 and the pixel array layer 130. Therefore, the coating layer 200 may prevent water or particles from being permeated into the pixel array layer 130 and the pad portion and prevent the pad portion from being electrode-shorted by reaction with an external environment such as a temperature, water, corrosive gas, or conductive particles. The coating layer 200 may obtain bond stiffness of the circuit film 181 while having flexibility to be applicable to a flexible display apparatus and a stretchable display apparatus, and may prevent the pad portion and lines on the first substrate 110 from being damaged during a laser release process.

The coating layer 200 may include a moisture-proof insulating member 210 for preventing water from being permeated into the pixel array layer 130, and a light-shielding material 220 for forming a single layer on the moisture-proof insulating member 210. Young's modulus, a water contact angle and laser transmittance of the coating layer 200 may be determined in accordance with materials of the moisture-proof insulating member 210 and the light-shielding material 220 and a configuration of a single layer.

The light-shielding material 220 may reduce a laser transmittance of the coating layer 200 by forming a single layer on the moisture-proof insulating member 210. For example, the coating layer 200 may form a single layer on the moisture-proof insulating member 210 by using the light-shielding material 220 after the moisture-proof insulating member 210 is formed by mixing a silicon elastomer base with a silicon elastomer curing agent at a certain ratio. According to one embodiment, the light-shielding material 220 may include a material for reducing UV transmittance of ultraviolet rays irradiated during a laser release process. The light-shielding material 220 may include a material that may absorb ultraviolet rays by having a bandgap energy of 3.2 eV to 3.6 eV. For example, the light-shielding material 220 may be a nano-particle composition that includes at least one of ZnO, GaN, AlGaN, InGaN, AlN, InN, SiC, and β-$Ga_2O_3$. Therefore, the light-shielding material 220 may reduce transmittance of ultraviolet rays irradiated during a laser release process for removing a carrier glass substrate by forming a single layer on the moisture-proof insulating member 210, thereby preventing the pad portion and the lines from being damaged.

FIGS. 6A to 6G are cross-sectional views illustrating process steps of a method for manufacturing a display apparatus according to one embodiment of the present disclosure, taken along line I-I' shown in FIG. 2.

Figure 6A:
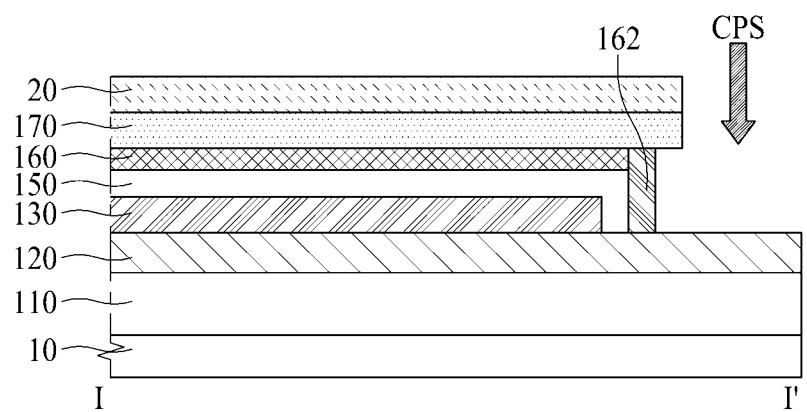
FIGS. 6A to 6G are cross-sectional views illustrating process steps of a method for manufacturing a display apparatus according to one embodiment of the present disclosure, taken along line I-I' shown in FIG. 2.

Referring to FIG. 6A, to manufacture the display apparatus 100 according to the present disclosure, a first carrier glass substrate 10 is provided, and a sacrificial layer (not shown) may be deposited on the first carrier glass substrate 10. In this case, the sacrificial layer may be made of an amorphous silicon (a-Si) or a silicon nitride film (SiNx). The first substrate 110, the multi-buffer layer 120, the pixel array layer 130, the encapsulation layer 150, and the filling layer 160 may sequentially be provided on the first carrier glass substrate 10. The first carrier glass substrate 10 may support the first substrate 110 while the first substrate 110, the multi-buffer layer 120, the pixel array layer 130, the encapsulation layer 150, and the filling layer 160 are being sequentially deposited. Therefore, the first carrier glass substrate 10 may temporarily serve as a support substrate.

A second carrier glass substrate 20 is provided, and a sacrificial layer (not shown) may be deposited on the second carrier glass substrate 20. The second substrate 170, the color filter 172 (not shown in FIG. 6A; refer to FIG. 4) and the black matrix 174 (not shown in FIG. 6A; refer to FIG. 4) may sequentially be provided on the second carrier glass substrate 20. If the first substrate 110, the multi-buffer layer 120, the pixel array layer 130, the encapsulation layer 150 and the filling layer 160 are completely deposited on the first carrier glass substrate 10, and the second substrate 170, the color filter 172 and the black matrix 174 are completely deposited on the second carrier glass substrate 20, the first substrate 110 and the second substrate 170 may be bonded to each other.

After the first substrate 110 and the second substrate 170 are bonded to each other, the non-display area NA on the first substrate 110 may be cut through a Cutting with Penetrable Scriber (CPS) process.

Figure 6B:
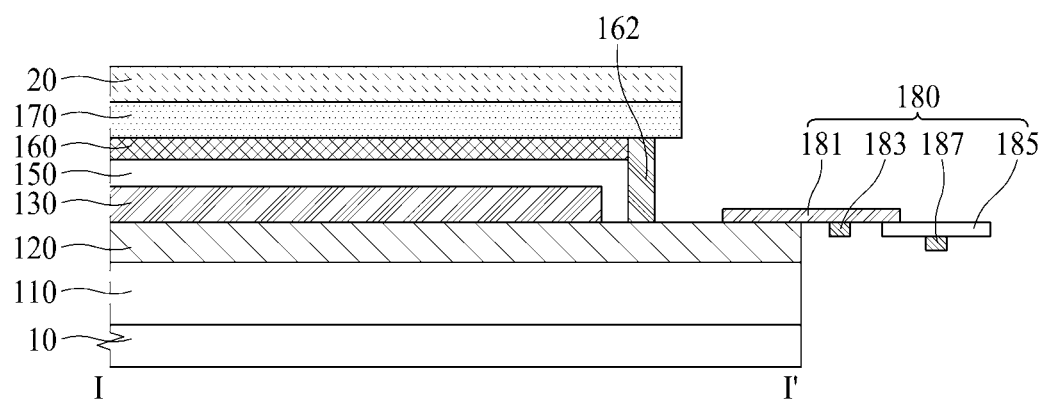

Referring to FIG. 6B, the circuit film 181 may electrically be connected with the pad portion (not shown) on the first substrate 110 in the non-display area NA on the first substrate 110. In detail, a hole pattern (not shown) may be provided in the non-display area NA on the first substrate 110 to expose the pad portion, and the circuit film 181 may electrically be connected with the pad portion for example, through an Anisotropic Conductive Film (ACF) filled in the hole pattern. According to one embodiment, the circuit film 181 may be realized as a flexible circuit film to reduce a bezel area of the display apparatus 100, and may be bent to surround the side of the second substrate 170.

Figure 6C:
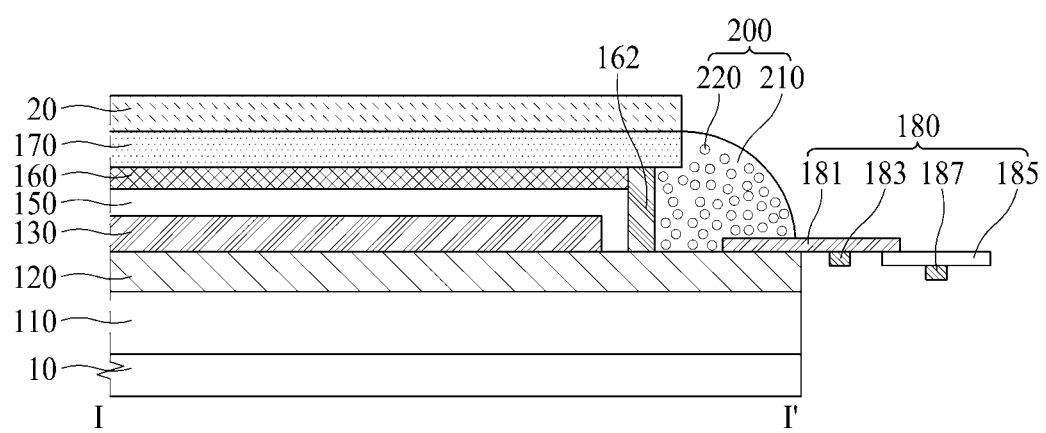

Referring to FIG. 6C, the coating layer 20 may be provided between the pixel array layer 130 and the circuit film 181 on the pad portion. In detail, the coating layer 200 may be provided to directly cover the side of the dam 162, the upper surface of the multi-buffer layer 120, and the circuit film 181 on the pad portion. That is, the coating layer 200 may cover (directly or indirectly) a contact surface between the circuit film 181 and the pad portion, the side of the pixel array layer 130, the side of the encapsulation layer 150, the side of the filling layer 160, the side of the second substrate 170, and the upper surface of the first substrate 110 exposed between the circuit film 181 and the pixel array layer 130.

The coating layer 200 may include a moisture-proof insulating member 210 for preventing water from being permeated into the pixel array layer 130, and a light-shielding material 220 mixed with the moisture-proof insulating member 210. Therefore, the coating layer 200 may prevent water or particles from being permeated into the pixel array layer 130 and the pad portion, prevent the pad portion from being electrode-shorted by reaction with an external environment such as a temperature, water, corrosive gas, or conductive particles and prevent the pad portion and lines on the first substrate 110 from being damaged during laser release process.

Figure 6D:
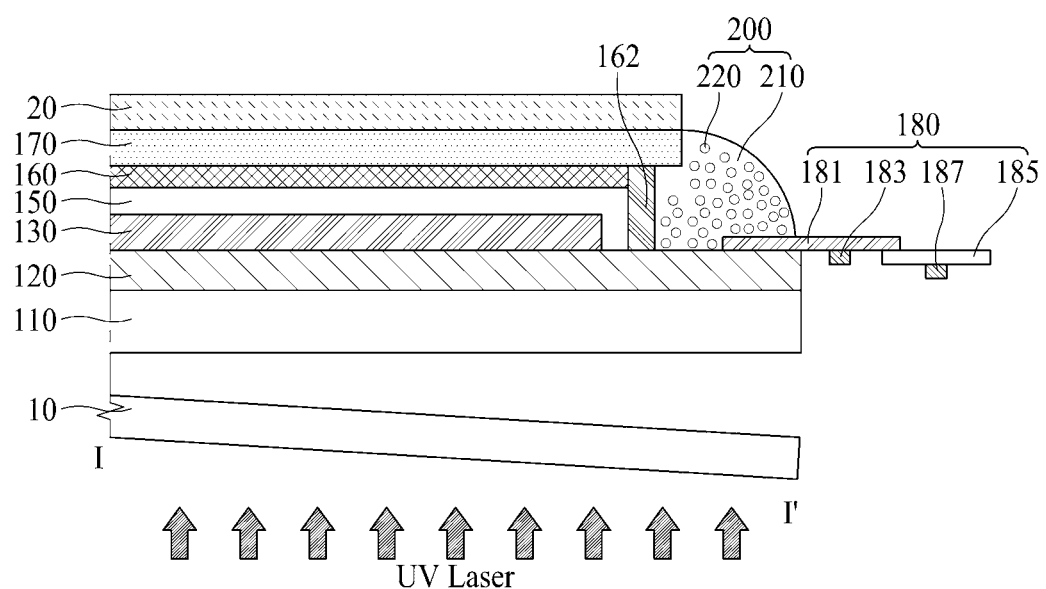

Referring to FIG. 6D, the first carrier glass substrate 10 may be removed through a laser release process after the circuit film 181 is electrically connected with the pad portion on the first substrate 110 and the coating layer 200 is provided between the pixel array layer 130 and the circuit film 181 on the pad portion. In detail, the sacrificial layer and the first substrate 110 may sequentially be deposited on the first carrier glass substrate 10, and if an ultraviolet laser is irradiated to the sacrificial layer, the sacrificial layer is separated from an interface of the first substrate 110, whereby the first carrier glass substrate 10 may be removed from the first substrate 110. For example, the sacrificial layer may be made of an amorphous silicon (a-Si) or a silicon nitride film (SiNx).

Figure 6E:
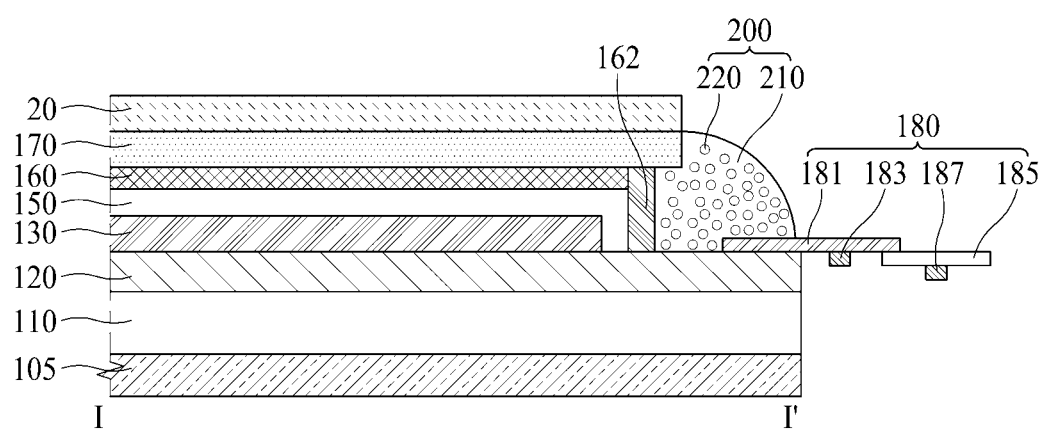

Referring to FIG. 6E, if the first carrier glass substrate 10 is removed from the lower surface of the first substrate 110, a first cover film 105 may be attached to the lower surface of the first substrate 110. In this case, the first cover film 105 may be made of an engineering plastic material, which is transparent and has flexibility, for example, PET (polyethyleneterephthalate) material. The first cover film 105 may be realized as a material having an excellent gas and water blocking effect and excellent light transmittance. According to one embodiment, the first cover film 105 may be attached to the lower surface of the first substrate 110 by a substrate attachment member to protect and support the first substrate 110. Therefore, the first cover film 105 may be arranged on the lower surface of the first substrate 110, thereby supporting the first substrate 110 during the process which is not completed, and protecting the first substrate 110 from an external environment.

Figure 6F:
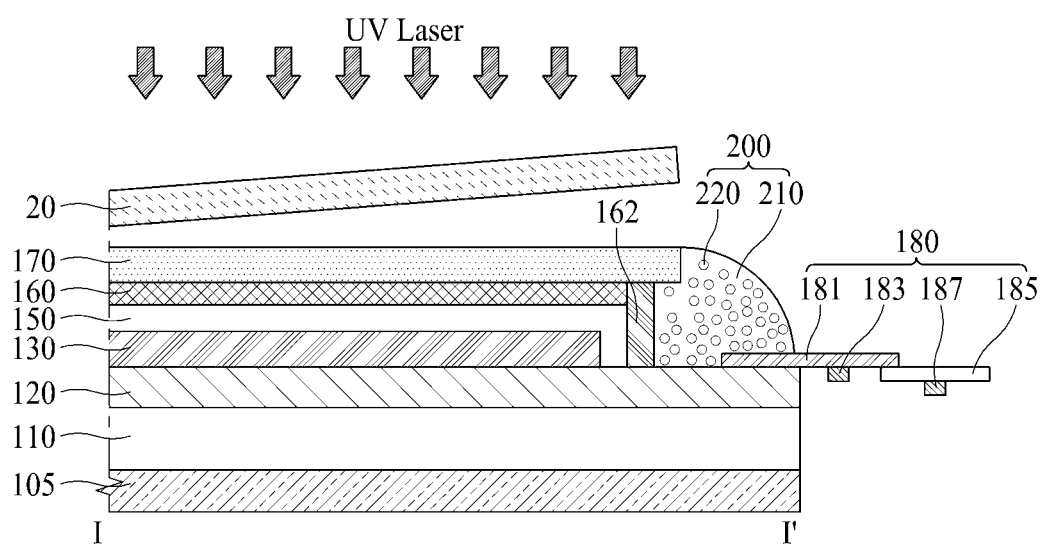

Referring to FIG. 6F, the second carrier glass substrate 20 may be removed through a laser release process. In detail, the second carrier glass substrate 20 may be attached to the second substrate 170 through the sacrificial layer (not shown), and if an ultraviolet laser is irradiated to the sacrificial layer, the sacrificial layer is separated from an interface of the second substrate 170, whereby the second carrier glass substrate 20 may be removed from the second substrate 170. For example, the sacrificial layer may be made of an amorphous silicon (a-Si) or a silicon nitride film (SiNx).

The coating layer 200 may be provided between the pixel array layer 130 and the circuit film 181 on the pad portion. In detail, the coating layer 200 may be provided to directly cover the side of the dam 162, the upper surface of the multi-buffer layer 120, and the circuit film 181 on the pad portion. That is, the coating layer 200 may cover (directly or indirectly) a contact surface between the circuit film 181 and the pad portion, the side of the pixel array layer 130, the side of the encapsulation layer 150, the side of the filling layer 160, the side of the second substrate 170, and the upper surface of the first substrate 110 exposed between the circuit film 181 and the pixel array layer 130. Therefore, the coating layer 200 may prevent the ultraviolet laser from being arrived on the first substrate 110 during a laser release process for the second carrier glass substrate 20, whereby the pad portion and lines on the first substrate 110 may be prevented from being damaged.

Figure 6G:
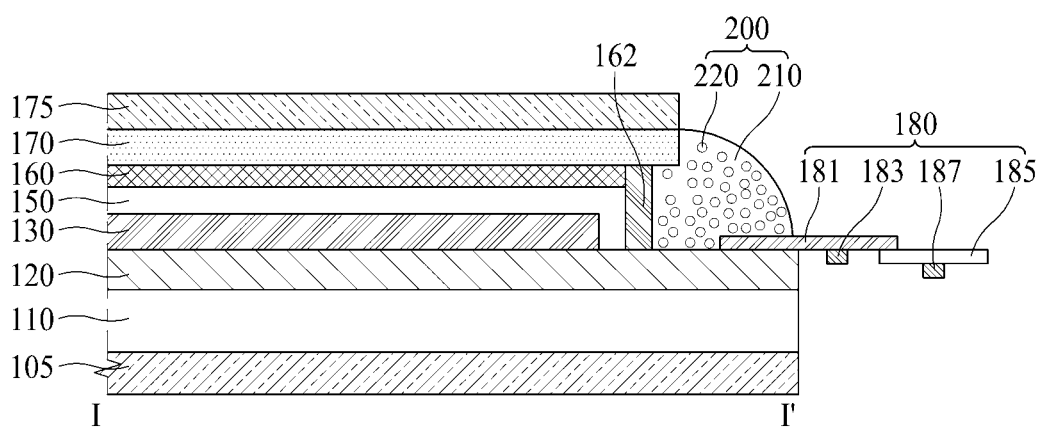

Referring to FIG. 6G, if the second carrier glass substrate 20 is removed from the upper surface of the second substrate 170, a second cover film 175 may be attached to the upper surface of the second substrate 170. In this case, the second cover film 175 may be made of an engineering plastic material, which is transparent and has flexibility, for example, PET (polyethyleneterephthalate) material. The second cover film 175 may be realized as a material having an excellent gas and water blocking effect and excellent light transmittance. According to one embodiment, the second cover film 175 may be attached to the upper surface of the second substrate 170 by a substrate attachment member to protect and support the second substrate 170. Therefore, as the second cover film 175 may be arranged on the upper surface of the second substrate 170, water or particles may be prevented from being permeated into the display apparatus, whereby durability of the display apparatus may be improved.

Figure 7:
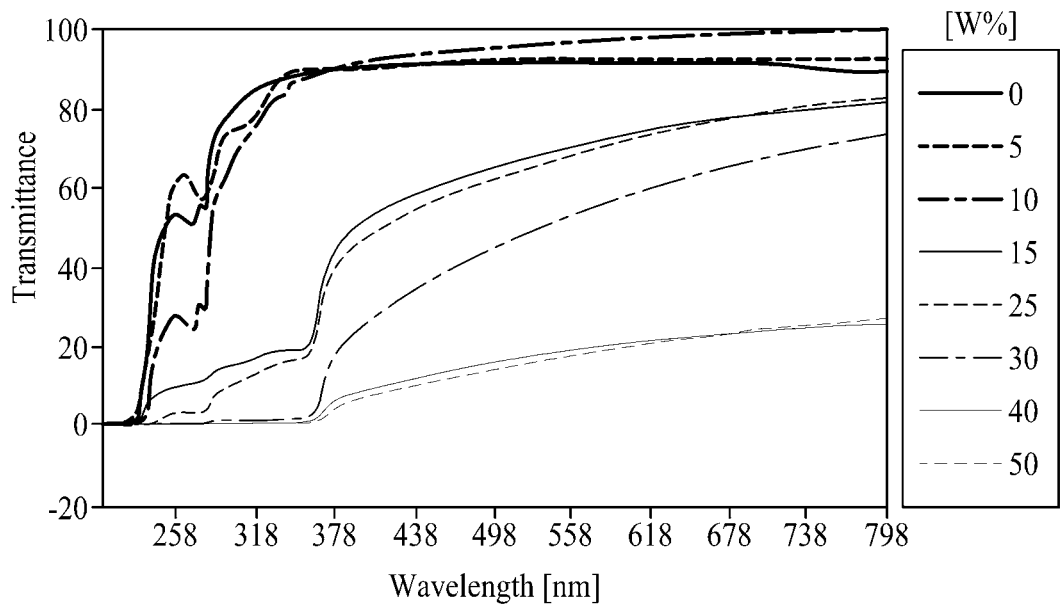
FIG. 7 is a graph illustrating a laser transmittance according to content of a light-shielding material and wavelength of a laser in a display apparatus according to one embodiment of the present disclosure.

FIG. 7 is a graph illustrating a laser transmittance according to content a light-shielding material and wavelength of a laser in a display apparatus according to one embodiment of the present disclosure. In detail, FIG. 7 illustrates a laser transmittance of the coating layer 200 according to a wavelength of a laser depending upon a content of the light-shielding material 220. The graph of FIG. 7 illustrates a laser transmittance of the coating layer 200 when the moisture-proof insulating member 210 is polydimethylsiloxane (PDMS) and the light-shielding material 220 is ZnO nano-particle.

Referring to FIG. 7, a laser transmittance of the coating layer 200 may be determined in accordance with a mixing ratio of the moisture-proof insulating member 210 and the light-shielding material 220.

For example, if the mixing ratio of the light-shielding material 220 is 0 weight % to 10 weight %, an ultraviolet (UV) transmittance of the coating layer 200 is lower than a visible light transmittance thereof. Therefore, it is noted that the coating layer 200 includes the light-shielding material 220 that absorbs an ultraviolet laser. However, the coating layer 200 fails to sufficiently shield ultraviolet rays due to a lack of the content of the light-shielding material 220 therein.

For another example, if the mixing ratio of the light-shielding material 220 is 15 weight % to 25 weight %, it is noted that a laser transmittance of the coating layer 200 is rapidly reduced to 18% or less when a wavelength of a laser is close to 340 nm. Therefore, if the mixing ratio of the light-shielding material 220 is 15 weight % or more, the coating layer 200 may serve as an ultraviolet shielding layer to prevent the pad portion and the lines on the first substrate 110 from being damaged during a laser release process. If the mixing ratio of the light-shielding material 220 is 15 weight % to 25 weight %, the content of the moisture-proof insulating member 210 is relatively high, whereby the coating layer 200 may maintain an elastic force to be used for a flexible display apparatus and a stretchable display apparatus while maintaining a moisture-proof insulation function, and at the same time may shield permeation of ultraviolet rays during a laser release process.

For other example, if the mixing ratio of the light-shielding material 220 is 30 weight % to 50 weight %, it is noted that a laser transmittance of the coating layer 200 is rapidly reduced to 0% when a wavelength of a laser is close to 340 nm. Therefore, if the mixing ratio of the light-shielding material 220 is 30 weight % to 50 weight %, the coating layer 200 may completely shield ultraviolet rays. That is, if the mixing ratio of the light-shielding material 220 is 30 weight % to 50 weight %, the coating layer 200 may serve as an ultraviolet shielding layer to prevent the pad portion and the lines on the first substrate 110 from being damaged during a laser release process. If the mixing ratio of the light-shielding material 220 is 30 weight % to 50 weight %, the content of the moisture-proof insulating member 210 is relatively low. Therefore, the light-shielding material 220 may maintain the mixing ratio ranging from 15 weight % to 50 weight % in the coating layer 200, whereby a moisture-proof insulation function, flexibility, and elastic force of the coating layer 200 and bond stiffness of the circuit film 181 may be increased and at the same time permeation of ultraviolet rays may be reduced during a laser release process.

Finally, the content of the light-shielding material 220 may be determined at a proper level such that a moisture-proof insulation function, flexibility, and elastic force of the coating layer 200 and bond stiffness of the circuit film 181 may be increased and at the same time the permeation of ultraviolet rays may be reduced during a laser release process.

Figure 8:
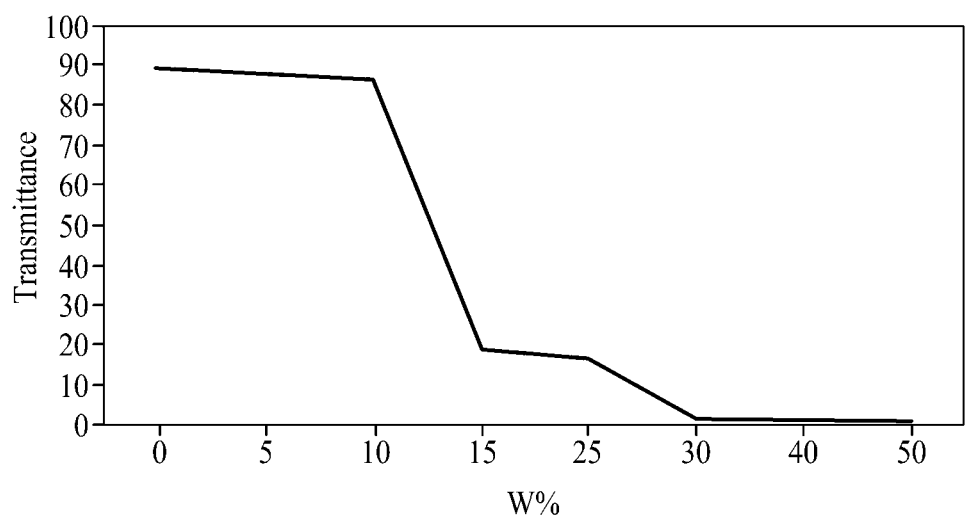
FIG. 8 is a graph illustrating a laser transmittance with respect to an ultraviolet wavelength according to a content of a light-shielding material in a display apparatus according to one embodiment of the present disclosure.

FIG. 8 is a graph illustrating a laser transmittance with respect to an ultraviolet (UV) wavelength according to a content of a light-shielding material in a display apparatus according to one embodiment of the present disclosure. In detail, FIG. 8 illustrates a UV transmittance of the coating layer 200 according to a content of the light-shielding material 220. The graph of FIG. 8 illustrates a UV transmittance of the coating layer 200 when the moisture-proof insulating member 210 is polydimethylsiloxane (PDMS), the light-shielding material 220 is ZnO nano-particle, and the UV wavelength is 343 nm.

Referring to FIG. 8, a UV transmittance of the coating layer 200 may be determined in accordance with a mixing ratio of the moisture-proof insulating member 210 and the light-shielding material 220.

For example, if the mixing ratio of the ZnO nano-particle is 0 weight % to 10 weight %, a UV transmittance of the coating layer 200 corresponds to 85% to 90%. Therefore, if the mixing ratio of the ZnO nano-particle is 0 weight % to 10 weight %, the coating layer 200 cannot serve as a UV shielding layer.

For another example, if the mixing ratio of the ZnO nano-particle is 15 weight % to 25 weight %, it is noted that a UV transmittance of the coating layer 200 is rapidly reduced to 18% or less. Therefore, if the mixing ratio of the ZnO nano-particle is 15 weight % or more, the coating layer 200 may serve as a UV shielding layer to prevent the pad portion and the lines on the first substrate 110 from being damaged during a laser release process. If the mixing ratio of the ZnO nano-particle is 15 weight % to 25 weight %, the content of the PDMS is relatively high, whereby the coating layer 200 may maintain an elastic force to be used for a flexible display apparatus and a stretchable display apparatus while maintaining a moisture-proof insulation function, and at the same time may shield permeation of ultraviolet rays during a laser release process.

For other example, if the mixing ratio of the ZnO nano-particle is 30 weight % to 50 weight %, it is noted that a UV transmittance of the coating layer 200 is reduced to be close to 0%. Therefore, if the mixing ratio of the ZnO nano-particle is 30 weight % to 50 weight %, the coating layer 200 may completely shield ultraviolet rays. That is, if the mixing ratio of the ZnO nano-particle is 30 weight % to 50 weight %, the coating layer 200 may serve as a UV shielding layer to prevent the pad portion and the lines on the first substrate 110 from being damaged during a laser release process. If the mixing ratio of the ZnO nano-particle is 30 weight % to 50 weight %, the content of the PDMS is relatively low as compared with the case that the mixing ratio of the ZnO nano-particle is 15 weight % to 25 weight %. Therefore, the ZnO nano-particle may maintain the mixing ratio ranging from 15 weight % to 50 weight % in the coating layer 200, whereby a moisture-proof insulation function, flexibility and elastic force of the coating layer 200 and bond stiffness of the circuit film 181 may be increased and at the same time permeation of ultraviolet rays may be reduced during a laser release process.

Finally, the content of the light-shielding material 220 may be determined at a proper level such that a moisture-proof insulation function, flexibility and elastic force of the coating layer 200 and bond stiffness of the circuit film 181 may be increased and at the same time permeation of ultraviolet rays may be reduced during a laser release process.

Therefore, the display apparatus according to the present disclosure may prevent water or particles from being permeated into the pixel array layer 130 and the pad portion and prevent the pad portion from being electrode-shorted by reaction with an external environment such as a temperature, water, corrosive gas, or conductive particles. Also, the display apparatus may include the coating layer 200 to obtain bond stiffness of the circuit film 181 while having flexibility to be applicable to a flexible display apparatus and a stretchable display apparatus, and may prevent the pad portion and lines on the first substrate 110 from being damaged during a laser release process.

As described above, according to the present disclosure, the following effects and advantages may be obtained.

In the display apparatus according to the present disclosure, the coating layer containing a light-shielding material may be provided between the pixel array layer and the circuit film on the pad portion to prevent water from being permeated into the pixel array layer and prevent the pad portion and the lines from being damaged by a laser release process.

In the display apparatus according to the present disclosure, the coating layer obtained by mixing the moisture-proof insulating member with the light-shielding material at a certain ratio may be used, whereby flexibility of the coating layer and bond stiffness of the circuit film may be secured and a laser may be shielded from being permeated into the pad portion and the lines during a laser release process.

In the display apparatus according to the present disclosure, the coating layer obtained by mixing the moisture-proof insulating member having a hydrophobic property and a low Young's Modulus with the light-shielding material having a low laser transmittance at a certain ratio may be used, whereby the coating may be realized to be applicable to a flexible display and a stretchable display.

In addition to the effects of the present disclosure as mentioned above, additional advantages and features of the present disclosure will be clearly understood by those skilled in the art from the above description of the present disclosure.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A display apparatus comprising:
    a substrate including a pixel array layer and a pad portion connected to the pixel array layer;
    a circuit film attached to the pad portion; and
    a coating layer provided between the pixel array layer and the circuit film on the pad portion,
    wherein the coating layer contains a light-shielding material,
    wherein the coating layer includes a moisture-proof insulating member for preventing water from being permeated into the pixel array layer, and the light-shielding material mixed with the moisture-proof insulating member.

2. The display apparatus according to claim 1, wherein the light-shielding material is a nano-particle composition that includes at least one of ZnO, GaN, AlGaN, InGaN, AN, InN, SiC, or $\beta$-$Ga_2O_3$.

3. The display apparatus according to claim 1, wherein the coating layer includes the light-shielding material mixed at a rate of 15 weight % to 50 weight %.

4. The display apparatus according to claim 1, wherein the moisture-proof insulating member is polydimethylsiloxane (PDMS).

5. The display apparatus according to claim 4, wherein the moisture-proof insulating member is formed by mixing a silicon elastomer base with a silicon elastomer curing agent to have Young's modulus of 360 kPa to 870 kPa.

6. The display apparatus according to claim 1, wherein the coating layer further includes Toluene to adjust viscosity of the coating layer.

7. The display apparatus according to claim 1, wherein the moisture-proof insulating member has hydrophobicity by having a water contact angle of 100° or more.

8. The display apparatus according to claim 1, wherein the moisture-proof insulating member has a dielectric constant of 2.3 to 2.8 to prevent parasitic capacitance from being formed on the substrate.

* * * * *